United States Patent [19]
Brent

[11] Patent Number: 5,644,306
[45] Date of Patent: Jul. 1, 1997

[54] SYNTAX INDEPENDENT VARIABLE LENGTH CODER FOR DIGITAL VIDEO CODER

[75] Inventor: Wilson William Brent, Singapore, Singapore

[73] Assignee: Matsushita Electric Industrial Co., Ltd., Osaka, Japan

[21] Appl. No.: 382,673

[22] Filed: Feb. 2, 1995

[30] Foreign Application Priority Data

Feb. 2, 1994 [JP] Japan ................................. 6-011197

[51] Int. Cl.[6] ................................................. H03M 7/40
[52] U.S. Cl. ................................................... 341/67
[58] Field of Search .............................. 341/67, 50, 51, 341/106

[56] References Cited

U.S. PATENT DOCUMENTS 4,728,975  3/1988  Hethium ................................. 342/401
4,985,766  1/1991  Morrison et al. .

OTHER PUBLICATIONS

Secretariat: Japan (JISC), "Coded Representation of Audio, Picture. Multimedia and Hypermedia Information," ISO/IEC JTC 1/SC 29 N 313, dated May 20, 1993.
Secretariat: Japan (JISC), "Coding of Audio, Picture, Multimedia and Hypermedia Information," ISO/IEC JTC 1/SC 29 N 0981 Rev, dated Mar. 31, 1995.

"Recommendation H.261 —Video Codec for Audiovisual Services at px 64 kbit/s", International Telegraph and Telephone Consulative Committee, Study Group XV—Report R 37, Aug. 1990.

"L64750/51 CCITT Variable Length Coder/Decoder", LSI Logic Integrated Circuit Data Sheet, Order Number 44023, Apr. 1991.

*Primary Examiner*—Brian K. Young
*Attorney, Agent, or Firm*—Ratner & Prestia

[57] ABSTRACT

The invention described herein is a syntax independent variable length coder and bitstream formatter for use in a digital video encoder. This bitstream coder uses a command buffer memory whose contents specify the syntax and content of the bitstream. Since this memory can be written by a programmable processor, the bitstream syntax is programmable. The bitstream coder supports to insert fixed length data bitsequences, variable length coded data bitsequences, and blocks of quantizod and variable length coded coefficient data bitsequences into the bitstream. The rate control feedback parameters can be calculated using a simple bitcounter mechanism which accurately counts the number of bits in the bitstream. Due to the relatively small size of the bitstream coder and its simple interfaces, it is suitable for inclusion in VLSI implementations of digital video encoders.

9 Claims, 3 Drawing Sheets 8 pels

BLOCK
Zigzag Scan Order 8 pels 8 pels

BLOCK
Alternate Scan Order

SYNTAX INDEPENDENT VARIABLE LENGTH CODER FOR DIGITAL VIDEO CODER

BACKGROUND OF THE INVENTION

1. Industrial Fields of Application

This invention relates to the implementation of a variable length coder (also known as "huffman Coder", or "entropy coder") and bitstream formatter for use in digital video coders.

2. Related Art of the Invention

In digital video coding, a video signal is compressed and transmitted as a bitstream conforming to a specific syntax like that of H.261 (described by CCITT Subgroup XV Document, "Recommendation H.261-Video Codec for Audiovisual Services at px 64 kbit/s", International Telegraph and Telephone Consultative committee, Study Group XV-Report R 37, August 1990), MPEG-1 (ISO MPEG Document, "CD 11172-Coding of Moving Pictures and Associated Audio for Digital Storage Media at up to about 1.5 Mbps", International Organization for Standardization, ISOIEC/JTC1/SC2/WG8, 1992), or MPEG-2 (ISO MPEG Document, "Third Working Draft (New York) Ammended by the Ad Hoc Group on WD Editing", International Organization for Standardization, ISO/IEC, Aug. 27, 1993). In these coders a lossy coding algorithm based on the discrete cosine transform (DCT) precedes a lossless encoder based on variable length coding which also performs bitstream syntax formatting. The input to the lossless coder (also know as "Variable Length Coder" or VLC) typically consists of transform coefficients for a macroblock of video data (16×16 for MPEG-1), the side information for the macroblock (macroblock type, motion vectors, etc. for MPEG-1), and the header side information corresponding to slices, pictures, or even more granular divisions of coded video data.

One function of the VLC is to convert the fixed length input data to variable length data. For example, this can hew done by run-level coding AC transform coefficients and entropy encoding the combinations of run-levels. It may also entropy encode some of the side information. Another function of the VLC is to format (reorder) the data to conform to the output bitstream syntax. A third function of the VLC is to determine rate control feedback parameters which are used to maintain the output bitrate near a target bitrate by controlling the amount of quantization imposed on DCT coefficients.

Most existing lossless coders support a subset of the existing standards, with no possibility to change the bitstream syntax. An example of such a device is the LSI LOGIC L64750 (described by LSI Logic Integrated Circuit Data Sheet, "L64750/51 CCITT Variable Length Coder/Decoder", Order Number 44023, April 1991) which supports the H.261 bitstream syntax only. Morrison (see "Video Coder", Morrison, et al, U.S. Pat. No. 4,985,766, Jan. 15, 1991) formats the bitstream by buffering coefficient data and side information separately. Special data switches are written in each buffer to indicate when the reading of one buffer should be toggled to the other buffer. By doing so, the data can be read from the buffers in the order necessary for the desired bitstream syntax. The reordered data is stored in a rate control buffer, and is read out and variable length coded at a rate necessary to result in the desired bitstream bitrate. The rate control feedback parameter in this case is the fullness of the rate control buffer. The number of bits of bitstream data read from the buffer is subtracted from the number of bits written into the buffer to result in a measure of the buffer's fullness. The buffer's fullness is used to moderate the amount of coefficient quantization so that the buffer does not underflow or overflow.

There are several problems which this invention solves. Due to the rapidly changing digital A/V coding technology and also due to the wide range of applications, it is necessary to support various bitstream syntaxes and allow for new syntax in the future. Formatting the data is typically very complicated, and is dependent upon the bitstream syntax, coding algorithm, and the characteristics of the coded data. An object of this invention is to develop a VLC in which changes to the syntax have no affect on the logic design of the coder. This is necessary especially for hardware which will support future standards now under development such as MPEG-2 or ATV in the USA.

A second problem solved by this invention is the need for a VLC small enough in size for implementation in VLSI suitable for a commercial consumer product. A third problem solved by this invention is that the VLC must be simple to use in order to make the development of consumer video coders easy and economical. An object of this invention is to support a simple interface to the VLC circuit. A fourth problem solved by this invention is that the data throughput is very high. For 4:1:1 sampled wide TV, a macroblock must be coded every 15 microseconds. The fixed length data (quantized coefficients plus side information) input rate to the VLC exceeds 27 MHz in this case. An object of this invention is to support the very high data throughput and simultaneously allow the VLC to format the macroblocks in a programmable fashion.

SUMMARY OF THE INVENTION

For the purpose of solving the above described problems, the present VLC was invented. In order to support many current and evolving bitstream syntaxes with the same hardware logic, a generic design which can format a bitstream containing variable length codes, fixed length codes and codes representing blocks of DCT coefficients has been invented. In order to keep the size of the VLC small, the bitstream output buffer memory is located after the final VLC logic in order that the VLC may be implemented within an integrated circuit (IC), and the output buffer memory does not have to be located within this IC. In order to keep the interface to the VLC simple, the bitstream syntax can be completely specified using a single command buffer memory to store syntax and data commands.

The coefficient data memory does not have to contain formatting information. In addition, a bitcounter which supports accurate bitcounting and a simple interface is supported for the calculation of the rate control parameters. In order to support the very high data rates inherent in video data, the invention can be implemented as a pipeline.

This invention comprises of a command buffer memory which stores commands and data which specify the desired bitstream syntax, a coefficient buffer memory which stores blocks of transform coefficients, a command interpreter which reads the syntax and data commands from the command buffer memory sequentially, inserting blocks of coefficients in the sequence as specified by contents of the command buffer memory, and distributes the commands to one of either a coefficient coder, a variable length coder or a fixed length coder. The invention further comprises a code selector which chooses bitsequence data from either the coefficient coder, variable length coder or fixed length coder, a concatenator for concatenating the chosen bitsequences to form a bitstream of the desired syntax, and an output controller for outputting the bitstream into an output buffer memory. Additionally, a bitcounter which counts the number of bitstream bits is included in the invention.

Initially, the command buffer memory is filled with syntax and data commands. This can be done, for example, by a programmable processor, in which case the syntax can be changed by changing the processors program. As well, perhaps simultaneously, the coefficient buffer memory is filled with quantized coefficient data. It may be possible for both of these buffers to contain enough space for at least 1 macroblock of information. Once the buffer's contents are valid, a start signal can be issued to the command interpreter to begin reading and processing the commands in the command buffer memory. This signal could, for example, originate from the programmable processor. A busy signal indicates that the bitstream coder is busy reading and processing commands from the command buffer memory. Once the bitstream coder has finished processing the commands from the command buffer memory, indicated by the processing of a special unique command word, the busy signal is de-activated.

The syntax and date commands are read sequentially from the command buffer memory. The order in which they are read and processed determines the resulting bitstream syntax.

The possible commands include a fixed length data command which specifies a specific bitsequence to insert into the bitstream; a variable length data command which specifies data which must be variable length coded, and the resulting variable length bitsequence inserted into the bitstream; a coefficient command which specifies that a block of coefficients must be variable length coded and the resulting bitsequences inserted into the bitstream; formating commands, for example, one which specifies that the next bitsequence which results from the following commands must be byte aligned such that the bitsequence's first bit is output as the most significant bit of the output bitstream databus; and a command which specifies the end of commands to process in the command buffer memory. For example, if the command and coefficient buffers store macroblocks of data, the final command would be treated as the end of macroblock data command. In addition, the coefficient command may include information such as the number of coefficients and what order the coefficients should be read from the coefficient buffer. For example, it could be read in either a zigzag scan order or an alternate scan order, both of which are specified in MPEG-2.

A variable length coder, for example, could be implemented based on a look-up table. Data from the variable length code command could be used to index the look-up table, from which a specification of a bitsequence could result. An example of a coefficient coder could be one which counts the number of contiguous zero valued coefficients and forms a run-level combination, which is then variable length coded, possibly using the same look-up table as the variable length coder uses.

A code selector can be used to select the bitsequence from the output of either the coefficient coder, the variable length coder, or the fixed length coder. The selected bitsequence can be passed to a concatenator which concatenates the bitsequences to form one continuous bitstream of bitsequences. Additionally, the concatanator must insert bits as necessary to perform bit stream formatting functions. For example, the previously mentioned command to align a following bitsequence to the output word boundary must be executed by the concatenator. Also, the concatanator may be used to form the bitstream which is inherently a serial data structure into words whose width match the output bitstream data bus width. These words of bitstream data are passed to an output controller which writes them to an output buffer memory. Sometimes the output bitstream data rate generated by the coder exceeds the input data rate of the output buffer memory. In this case, the output controller will signal the bitstream coder to wait. The output controller may also signal the bitstream coder to wait if the output buffer memory is full.

Additionally, a bit counter can be used to count the number of bitstream bits generated by the concatenator. An example bit counter could include a 23 bit counter which can be read using a 16 bit data bus. The 16 bit data can be selected from the 23 bits using a shifter, which effectively applies a 16 bit window to the 23 bit accumulator data. In this way it is possible to determine the number of bits used to code a small amount of video data, for example a macroblock, and also a large amount of data such as a picture, or group of pictures, using the same counter and interface, For example, if the least significant 16 bits are read, a bitcount up to 65535, accurate to 1 bit can be determined. If the most significant 16 bits are read, a bitcount up to 8388480, accurate to 128 bits can be determined.

Figure 1:
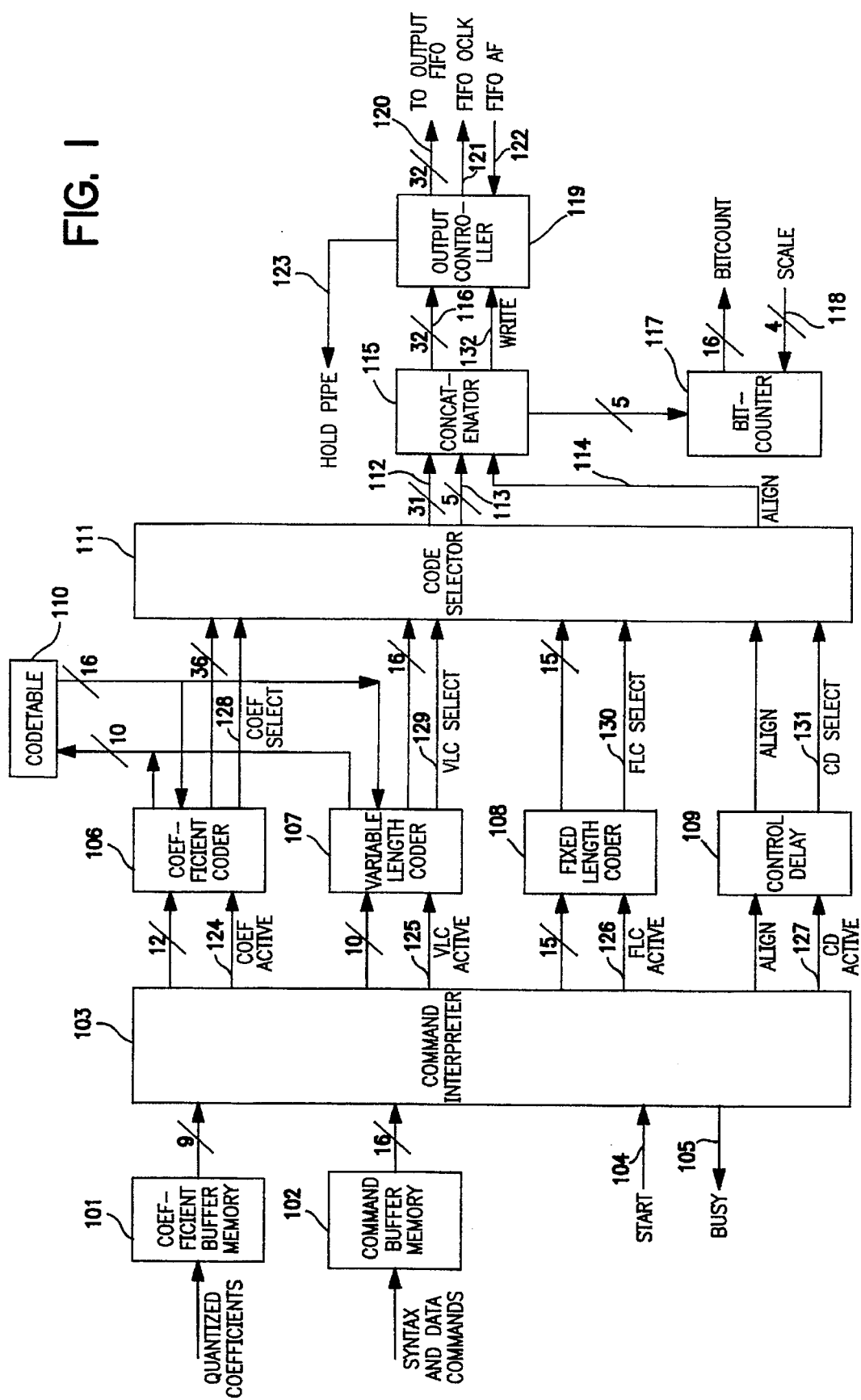
FIG. 1 is an example embodiment of the invented bitstream coder.

The numerals in the diagrams represent:

101 coefficient buffer memory
102 command buffer memory
103 command interpreter
104 start signal line
105 busy signal line
106 coefficient coder
107 variable length coder
108 fixed length coder
109 control delay
110 codetable
111 code selector
112 code selector output bitsequence length bus
113 code selector output bitsequence code bus
114 code selector output align signal line
115 concatenator
116 concatenator output bitstream bus
117 bitcounter
118 bitcounter input scale bus
119 output controller
120 output controller output bitstream bus
121 output FIFO write clock signal line
122 output FIFO almost full signal line
123 hold pipe signal line
301 fixed length code command format
302 variable length code command format
303 coefficient command format
304 control data command format
305 fixed length code command length field
306 fixed length code command fixed length code field 307 variable length code command code table address field
308 coefficient command intra field
309 coefficient command alt scan field
310 coefficient command coef count field
311 control data command align field
312 control data command mbe field Preferred embodiments An example embodiment of this invention is shown in FIG. 1. In FIG. 1, bus widths greater than 1 bit are indicated by a small stroke through the bus with a number representing the bus width. For this embodiment, all bus widths and memory sizes are examples only.

Figure 2:
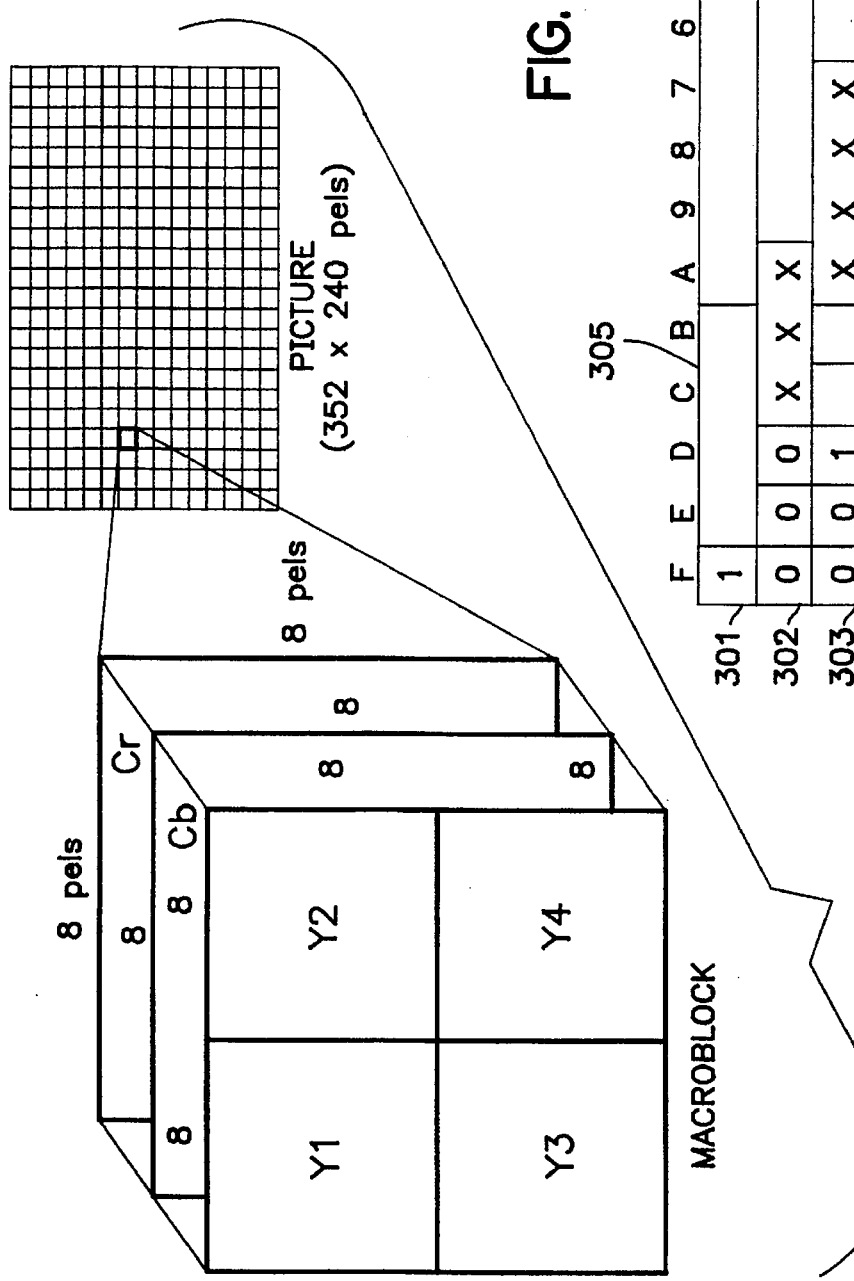
FIG. 2 is an example of the macroblock format used in MPEG-1 video coders.

The coefficient buffer memory (101) is used to store quantized coefficients. For example, this memory could be implemented as a 6*64*9 bit memory. In this case, each coefficient is 9 bit wide and each memory can store 6 blocks of 8*8 coefficients. This would be suitable for storing an MPEG-1 macroblock, for example, because MPEG-1 divides a picture into macroblocks with each macroblock comprising four 8*8 blocks of luminance pixels and two 8*8 blocks of chrominance pixels. FIG. 2 shows an example of how a picture can be partitioned into slices of macroblocks for MPEG-1.

The command buffer memory (102) is used to store bitstream syntax and data commands. For example, it could be implemented using a 64*16 bit memory, in which case 64 commands can be stored. For this embodiment, each macroblock of data can use 64 commands to format the bitsequence that represents the macroblock. It is possible for these commands to be written using a programmable processor.

The command interpreter (103) reads the coefficients and commands and distributes this data to the appropriate coder (106,107,108) or the control delay (102). For this embodiment, once the contents of the coefficient buffet memory (101) and command buffer memory (102) contain all the information needed to format the bitsequence for the macroblock, the start signal (104) is activated. The command interpreter responds by setting the busy signal (195), and reading the commands from the command buffer memory (102) sequentially, starting form the first memory location. It analyzes each command and sends the relevant data in the command to the coefficient coder(106), variable length coder (107), fixed length coder (108), or control delay (109).

Figure 3:
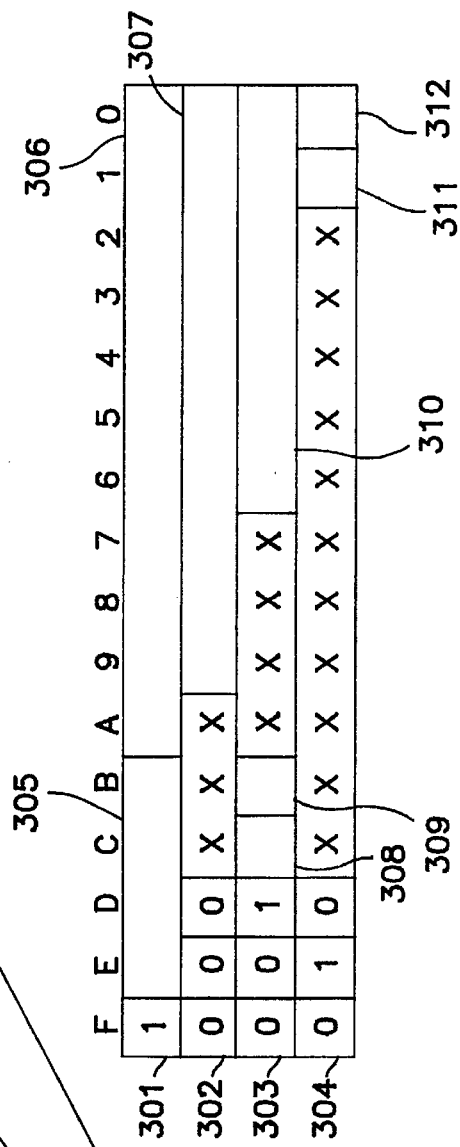
FIG. 3 is an example of a command format for storing commands in the command buffer memory of the embodiment of FIG. 1.

For example, the format of the commands processed by the command interpreter could be of the form shown in FIG. 3, but is not limited to the form shown in FIG. 3. To insert a known bitsequence the fixed length codeword command (301) can be used. The LENGTH (305) is set to the number of bits in the bitsequence, and the FIXED LENGTH CODE (306) is set to the desired bitsequence, right aligned with the leftmost significant bit representing the first bit and the rightmost representing the last bit of the bitsequence. For example, to insert the bitsequence "11010" into the bitstream, the codeword is set to "1010160000011010". In this case, the most significant bit is set to indicate the command is a fixed length codeword command, the next 4 bit "0101" represent the length of the bitsequence (5 bits), and the least significant 5 bits "11010" represent the bitsequence data.

To insert a variable length bitsequence, the variable length codeword command (302) is used. For this example embodiment, the codetable (110) can be implemented using a simple look-up table, implemented as a 1 K×16 RAM. The input to the look-up table is the fixed length data, and the output is the bitsequence and length that represents that data.

Thus, to insert a variable length bitsequence into the bitstream, the CODE TABLE ADDRESS(307) is placed in the variable length codeword commands 10 least significant bits, and this address is used to determine the corresponding bitsequence using the variable length coder(107). It applies the address to the codetable (110) and returns the bitsequence length and code.

To insert a bitsequence representing one block of coefficients, the coefficient command (303) is used, In this case a block of coefficients will be read from the coefficient buffer memory (101) and passed to the coefficient coder (103). For this embodiment, the order of reading the blocks is fixed. The start signal (104) initializes the command interpreter (103) so that the first coefficient command results in the reading of the first block of coefficients from the coefficient buffer memory (101). Subsequent coefficient commands will result in the next block being read. For example, for MPEG-1, the order of reading the blocks is the same as the order in which they must appear in the bitstream, as the four luminance blocks followed by the two chrominance blocks. Referring to FIG. 2, each of the macroblocks consists of 4 Y blocks and 2 chrominance blocks and the order in which the blocks occur in the bitstream are Y1, Y2, Y3, Y4, Cb, Cr. Note however that this invention is not limited to this macroblock structure.

Figure 4A:
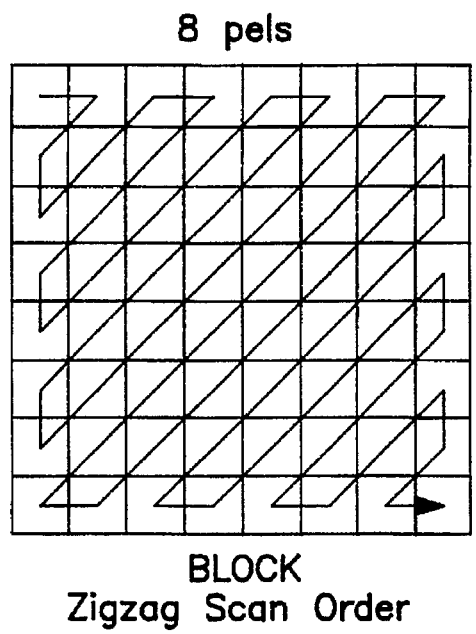
FIGS. 4(a) and 4(b) describe the coefficient scan orders supported by MPEG-2.
Figure 4B:
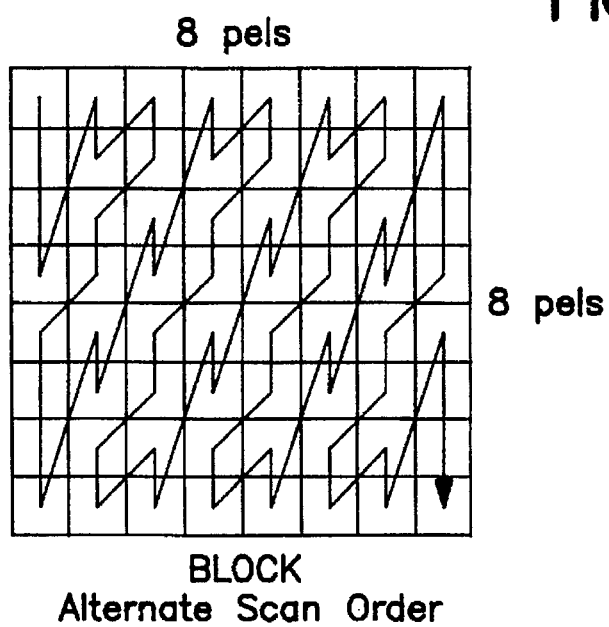

For this embodiment, the number of coefficients read for the block is specified in the 7 least significant bits of the coefficient command (303). The range of COEF COUNT (310) is from 0 to 64 for this embodiment. This will allow the support of various block sizes as may be required for scalable macroblock sizes like that specified by MPEG-2. Additionally, the coefficient command format for this embodiment includes the INTRA bit (308) which indicates whether the block of coefficients should be coded as an intra block or a non-intra block. In MPEG-1, the first coefficient of an intra block is coded differently than the first coefficient of a non-intra block. In this embodiment, the INTRA bit of the coefficient command is set to indicate that the block should be coded as an intra block. Also for this embodiment, the coefficient command includes an ALT SCAN bit (309) which indicates the order in which the coefficients should be read from the coefficient buffer memory. For example, MPEG-2 supports 2 scan orders: a zigzag scan and an alternate scan. For this embodiment, the ALT SCAN bit is set if the coefficients should be read in the alternate scan order. FIGS. 4(a) and 4(b) show the order in which coefficients are read for MPEG-2.

The reordering of the coefficients to accomplish the zigzag or alternate scan function is performed by the command interpreter (103). This can be accomplished using a RAM look-up table, for example. The input to this scan table could be a sequential coefficient counter, with the output from the table used to determine the address in the coefficient buffer memory (101) from which the coefficient is read. In this way, any scan order is possible simply by changing the contents of the scan table. If 2 scan tables are used, as in this embodiment, the ALT SCAN bit (309) can be used to select the table.

Thus, for this embodiment, to perform the coding of a block of coefficients the following occurs: The command interpreter (103) reads from the command buffer memory (101) a command with the coefficient command format (303). This command specifies which block is to be read from the coefficient buffer memory (101). The first time this command is read by the command interpreter (103) after a start signal (104), the first coefficient block is read from the coefficient buffer memory (101). Subsequent commands will result in the reading of subsequent blocks. The number of coefficients to be read for the block is indicated in the COEF COUNT field (310) of the coefficient command (303). The order in which the coefficients is read from the coefficient buffer memory (101) is also specified in the coefficient command. A scan look-up table is accessed sequentially which indicates which coefficient in the block is read. The choice of look-up table is specified using the ALT SCAN bit (309) IN THE COEFFICIENT COMMAND FORMAT (302). The coefficients are read from the coefficient buffer memory (101) in the desired bitstream syntax order. They are passed from the command interpreter (103) to the coefficient coder (106). In addition to the 9 bits of coefficient data, there are an additional 4 bits of information passed to the coefficient coder (106): the block start signal which indicates that the first coefficient of the block is being passed; the block end signal which indicates that the last coefficient of the block has been passed; INTRA signal which indicates whether the block is an intra block or non-intra block as specified by the INTRA field (308) in the coefficient command format (303), and the COEF ACTIVE signal (124) which specifies that the coefficient coder is active.

For this embodiment, the coefficients are passed in syntax order to the coefficient coder (106) along with the block start, block end, intra and coefficient active signals. The coefficient coder (106) run-level encodes the coefficients in which the number of zero coefficients preceding a non-zero coefficient is counted. This combination of run-level is variable length coded using a codetable, possibly the same codetable (110) as is used by the variable length coder (107). There is some additional logic required because some of the possible run-level combinations may not exist in the codetable, in which case these run-level combinations may be coded as fixed length codes. However, the method of coding the coefficients is not a fundamental issue to this invention, and is not described herein.

For this embodiment, the control command (304) is used for two purposes: to indicate the end of a macroblock of syntax commands by setting the MBE (MacroBlock End) bit (312); and to force the alignment of a following bitsequence to an output word boundary by setting the ALIGN bit (311). When the command interpreter processes the control command and determines that the MBE bit (312) is set, the BUSY signal (105) is cleared to indicate that the command interpreter (103) has finished processing the macroblock of commands and data, and the remaining commands in the command buffer memory (102) are ignored. This indication can be used by a programmable processor, for example, to indicate when it is possible to fill the command buffer memory (102) with syntax and data commands corresponding to the next macroblock of data.

In some bitstream syntaxes such as H.261, MPEG-1 and MPEG-2, it is necessary to force the first bit of a bitsequence to align to a word boundary. Although the output bitstream is understood to be inherently serial in nature, today's digital technology is based largely on parallel data bus architectures. Subsequently, it is expected that coded video bitstreams will be transmitted as sequences of words rather than sequences of bits. However, the data content will be the same. For example, a word sequence can be made from a bitsequence by using a serial to parallel converter. In order to make the processing of word sequences easier, it is sometimes desirable to force a particular bitsequence to occupy a specific place within a word. For example, H.261, MPEG-1 and MPEG-2 all support picture header bitsequences which indicate the start of data representing a picture. This header must be located such that the first bit transmitted coincides with the most significant bit of a byte. In this case, if the video coder had an output bus width of 8 bits, the first bit of the header bitsequence would be located in the most significant output bit location. For this embodiment, the alignment is perfomed by filling the preceding unused bits of the output word with zero, and aligning to the next output word, which is 32 bits in width.

For this embodiment the command intepreter (103) reads the command buffer memory (102), reads the coefficient buffer memory (101) and distributes this data and associated control information to the coefficient coder (106), variable length coder (107), fixed length coder (108), and the control delay (109). For this embodiment, the associated control information includes a signal to each coder (106,107,108) and the control delay (109) which indicates if the data is intended for that coder or the control delay. These signals are COEF ACTIVE (124), VLC ACTIVE (125), FLC ACTIVE (126) and CD ACTIVE (127). These signals activate the respective coders or control delay.

The functions of the coefficient coder (106) and variable length coder (107) for this embodiment have been described. The function of the fixed length coder (108) is to convert the data in the fixed length data command (301) to a format appropriate for the code selector (111). The control delay (109) delays the ALIGN command so that the ALIGN signal is delayed exactly the same amount as is all other data through the coders (106,107,108). All these coders (106, 107,108) and the control delay (109) have the same delay. This ensures that the data received by the code selector (111) arrives in the same order in which the data is distributed to the coders (196, 107,108) and the control delay (109), thus ensuring the order of the bitsequences is the same as the desired bitstream syntax.

For this embodiment, the outputs of the individual coders (106, 107,108) have a similar format: bitsequence length, bitsequence data, and the respective select signal (128,129, 130) which indicates that this data is active The control delay (109) outputs the ALIGN signal and a CD SELECT signal (131) indicating if the ALIGN signal is active. The code selector (111) uses these select signals (128,129,130, 131) to select which of the output signals are to be sent to the concatenator (115). Thus, the output from the code selector (111) for this embodiment consists of a bitsequence length (112), bitsequence code (113), and align signal (114). If there is no valid bitsequence, as is the case during an align signal, the bitsequence length (112) is set to 0.

For this embodiment, the concatenator (115) receives successive bitsequence lengths (112) and bitsequence codes (113), which it concatenates to form a bitstream (116) which in this embodiment is actually a word stream 32 bits wide. The WRITE signal (132) indicates when the output from the concatenator (115) is to be written to the output controller (119). When the ALIGN signal (114) is received by this concatenator, it will complete and output the current output word. In this embodiment, bits which are not specified by bitstream codes (113) as is the case when an align command occurs are forced to zero. The exact number of resulting bits corresponding to each received bitsequence code (113) and align signal (114) are output to the bitcounter(117). For this embodiment, the bitcounter (117) accumulates the lengths received from the concatenator to give a running summation of the number of bits which are concatenated by the concatenator (115). In this embodiment, a 23 bit counter is used to accumulated the lengths. A 16 bit window is applied to the 23 bit summation in order to permit a 16 bit data bus to be used to access the accumulator. The position of the window is specified by a 4 bit SCALE signal (118). If the SCALE is 0, the least significant 16 bits are read. For example, to determine the number of bits used to encode a macroblock of data, the bitcounter scale is first set to 0, then the bitcount is read. This count value represents the accumulated value before the macroblock is coded. Then the macroblock is coded and the bitcount is read again. This count value represents the accumulated value after the macroblock is coded. The difference is the number of bits used to code the macroblock. This method can also be used to determine the number of bits used to code a picture. Since a picture may be coded with more than 65535 bits (which is the maximum number representable by 16 bits) the scale factor could be set to 4. In this case, the window is shifted 4 places left and each count represents 16 bits. Thus the range of bits counted for a picture could be up to 1048576, or the maximum count that can be represented by 20 bits. This count value can be used to determine the necessary rate control parameters.

For this embodiment, the output controller (119) is used to write the output bistream (120) to an output buffer memory, implemented as a FIFO. The data is written only if the FIFO is not almost full, indicated when the FIFO AF signal (122) is not active. If the FIFO is almost full, the the output controller (119) sets the HOLD PIPE signal (123) which indicates to the rest of the circuit that the coding process should hold. Once there is room in the FIFO again, the coding can continue.

For the embodiment of FIG. 1, the circuit can be implemented as a synchronous data pipeline. Each stage of the pipeline consists of some asynchronous logic followed by a data latch. All the data latches share the same clock. The HOLD PIPE signal (123) can be used to disable the latching of the data each clock period. By this method the entire pipeline can be stopped when the output FIFO is almost full so that no bitstream data is lost.

Note that the described embodiment is simply one embodiment of the invention. Many things can be changed such as the command buffer memory data format. For example, the coefficient command format (303) could use different and/or additional control bits to INTRA(308) and ALT SCAN (309) to control the function of the coefficient coder (106). The sizes and contents of each field number of different commands could be changed. In addition, data bus widths, memory sizes, the contents of the codetable (110) and previously mentioned look-up tables can be changed. The function of each of the coders (106,107,108) can be changed, with the limitation that the coefficient coder (106) must result in bitsequences which represent some coefficients, the variable length coder (107) must encode data as variable length bitsequences, and the fixed length coder (108) must encode fixed length bitsequences. For example, the method of coding coefficients does not have to use run-level coding. Additionally, the control delay (109) in this embodiment is not necessary in every embodiment since some embodiments will not require the control signals to be delayed.

The effect of this invention is an implementation of a generic bitstream coder capable of supporting many existing coded digital video bitstream syntaxes such as H.261, MPEG-1 and MPEG-2, as well as future bitstream syntaxes. It can be implemented in a cost efficient manner due to it's compact size suited for inclusion in a VLSI video coder, and due to it's simple interfaces. By implementing the invention as a pipeline, the high data rates of video data can be supported.

What is claimed is:

1. A digital video bitstream coder comprising:
   a coefficient buffer memory for storing transform coefficients;
   a command buffer memory for storing bitstream format and data commands;
   a coefficient coder for encoding said coefficients as variable length bitsequences;
   a variable length coder for encoding data in said data commands as variable length bitsequences;
   a fixed length coder for encoding data in said data commands as fixed length bitsequences;
   a command interpreter for reading said commands from said command buffer memory and for reading said coefficients from said coefficient buffer memory and for distributing data and control signals to said coefficient coder, said variable length coder, and said fixed length coder;
   a codetable for storing codewords, said codewords means for defining said variable length bitsequences and length of said bitsequences;
   a code selector for selecting either said variable length bitsequence from said coefficient coder, said variable length bitsequence from said variable length coder, said fixed length bitsequence from said fixed length coder, or a null bitsequence;
   a concatenator for concatenating selected bitsequences to form a bitstream, said bitstream being a sequence of words of 1 or more bits in width;
   a bitcounter for counting the number of bits concatenated to form said bitstream;
   an output controller for outputting said bitstream to an output buffer memory; and
   syntax ordering means for ordering said bitsequences such that said bitstream conforms to a desired bitstream syntax.

2. A digital video bistream coder according to claim 1 wherein said syntax ordering means comprises:
   means to read said commands from said command buffer memory sequentially in the same order in which they occur in said command buffer memory;
   means for switching reading from said command buffer memory to coefficient buffer memory, said switching occuring whenever a command word is read from said command buffer memory;
   means for switching reading from said coefficient buffer memory to command buffer memory, said switching occurring whenever all of the desired coefficients have been read from said coefficient buffer memory, the number of desired coefficients being indicated by said coefficient command word; and
   means for ordering said bitsequences means the order in which said commands and said coefficients are read from said command buffer memory and said coefficient buffer memory respectively is the same order as their respective resulting bitsequences concatenated to form said bitstream.

3. A digital video bitstream coder according to claim 1 wherein said command interpreter comprises:
   coefficient scanner means for ordering the reading of said coefficients from said coefficient buffer.

4. A digital video bitstream coder according to claim 1 wherein said command interpreter comprises:
   coefficient scanner means for ordering the reading of said coefficients from said coefficient buffer;

start signal means for staring the sequential reading and processing of a group of commands;

busy signal means for indicating that said command interpreter is busy reading and processing a group of commands; and means for indicating that said command interpreter has finished processing a group of commands, the finished indication means being responsive to the occurrence of a unique command read from said command buffer memory.

5. A digital video bitstream coder according to claims 3 or 4 where in said coefficient scanner means comprises:

1 or more scan order look-up tables in which are stored the order of said reading of said coefficients from said coefficient buffer, and means for selecting said scan order look-up table, said selection based on the contents of said coefficient command word.

6. A digital video bitstream coder according to claims 1, 2, 3, or 4 wherein said concatenator comprises:

means for concatenating selected bitsequences to form a bitstream, said bitstream being a sequence of words of 1 or more bits in width; and means for aligning the first bit of the subsequent bitsequence to a word boundary, said alignment based on the occurrence of a alignment command word.

7. A digital video bitstream coder according to claim 1, 2, 3, or 4 wherein said bitcounter comprises:

a counter for counting the number of bits concatenated to form said bitstream; and shifter means for scaling the bitcount by an amount specified by a scale factor.

8. A digital video bitstream coder according to claim 1, 2, 3, or 4 wherein said output controller comprises: means for outputting said bitstream to an output buffer memory; and means for stopping the reading and processing performed by said digital video bitstream coder whenever said output buffer memory cannot be written to.

9. A digital video bit stream coder comprising:

a buffer memory for storing transform coefficients and data commands;

coding means for encoding said coefficients and said data commands as bit sequences;

a command interpreter for reading said commands from said buffer memory and for reading said coefficients from said buffer memory and for distributing data and control signals to said coding means;

a code selector for selecting one of said bit sequences from said coding means for a null sequence;

a concatenator for concatenating selected bit sequences to form a bit stream;

a bit counter for counting the number of bits concatenated to form said bit stream; and an output controller for outputting said bit stream to an output buffer memory.

* * * * *